United States Patent
Kim et al.

(10) Patent No.: US 7,246,280 B2
(45) Date of Patent: Jul. 17, 2007

(54) MEMORY MODULE WITH PARALLEL TESTING

(75) Inventors: Youn-Cheul Kim, Seoul (KR);
Hee-Joo Choi, Suwon-Si (KR);
Kae-Won Ha, Seongnam-Si (KR);
Joon-Hee Lee, Yongin-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 304 days.

(21) Appl. No.: 11/086,059

(22) Filed: Mar. 22, 2005

(65) Prior Publication Data

US 2005/0216809 A1   Sep. 29, 2005

(30) Foreign Application Priority Data

Mar. 23, 2004   (KR)   ...................... 10-2004-0019628
Sep. 2, 2004   (KR)   ...................... 10-2004-0070025

(51) Int. Cl.
*G11C 29/00* (2006.01)
(52) U.S. Cl. ...................... 714/719; 714/733
(58) Field of Classification Search ................ 714/718, 714/719, 733; 365/201; 716/4; 257/666
See application file for complete search history.

(56) References Cited

U.S. PATENT DOCUMENTS 5,075,892 A * 12/1991 Choy .......................... 714/719
5,388,104 A * 2/1995 Shirotori et al. ............. 714/718
5,740,179 A * 4/1998 Dorney et al. ............... 714/719
5,959,911 A * 9/1999 Krause et al. ............... 365/201
5,995,731 A * 11/1999 Crouch et al. ................. 716/4
6,058,495 A * 5/2000 Lee et al. .................... 714/718
6,400,623 B2 6/2002 Ohno ......................... 365/201
6,754,116 B2 * 6/2004 Janik et al. .................. 365/201
6,777,785 B1 * 8/2004 Shyu .......................... 257/666
6,853,597 B2 * 2/2005 Jain ............................ 365/201
2003/0063517 A1 4/2003 Jain

OTHER PUBLICATIONS

Korean Patent Application No. 990065204 to Hong et al., having Publication date of Jul. 11, 2001 (w/English Abstract page).
Korean Patent Application No. 990065206 to Jang et al., having Publication date of Jul. 11, 2001 (w/English Abstract page).
Korean Patent Application No. 1020000037312 to Yoo, having Publication date of Jan. 10, 2002 (w/English Abstract page).
Japanese Patent No. JP6119200 to Keiichi, having Publication date of Apr. 28, 1994 (w/ English Abstract page).

* cited by examiner

*Primary Examiner*—David Ton
(74) *Attorney, Agent, or Firm*—Monica H. Choi (57) ABSTRACT

Each memory chip of a memory module tests a total of N data bits from X memory blocks for efficient testing and outputs N/X test data bits from one of the memory blocks. A memory module includes a plurality of memory chips and a plurality of comparison units. Each comparison unit is disposed within a respective memory chip for testing a plurality of test data bits from a plurality of memory blocks. In addition, each comparison unit outputs test data bits from one of the memory blocks within the respective memory chip.

20 Claims, 10 Drawing Sheets

MEMORY MODULE WITH PARALLEL TESTING

BACKGROUND OF THE INVENTION

This application claims priority to Korean Patent Application Nos. 2004-19628 filed on Mar. 23, 2004, and 2004-70025 filed on Sep. 2, 2004, in the Korean Intellectual Property Office, the disclosures of which are incorporated herein in their entirety by reference.

FIELD OF THE INVENTION

The present invention relates generally to memory modules, and more particularly, to parallel testing within a memory module for increased efficiency.

DESCRIPTION OF THE RELATED ART

Figure 1:
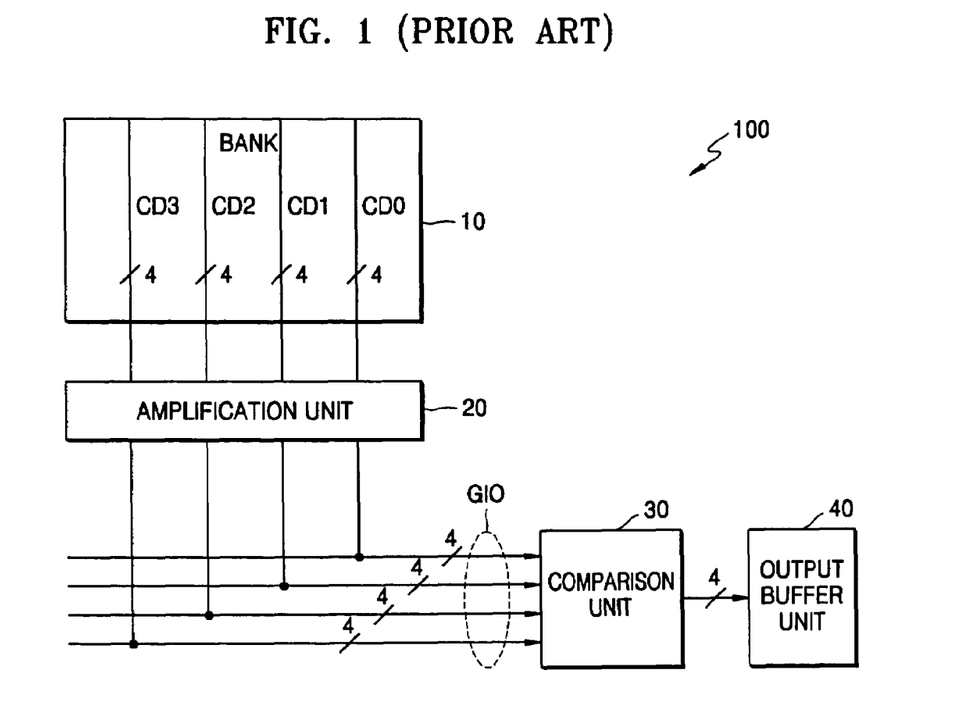
FIG. 1 shows a conventional parallel testing apparatus for a semiconductor memory device.

FIG. 1 shows a conventional parallel testing apparatus 100 for a semiconductor memory device. Referring to FIG. 1, the conventional parallel testing apparatus 100 includes an amplification unit 20, global input/output lines (GIO), a comparison unit 30, and an output buffer unit 40. The amplification unit 20 amplifies data received from memory cells of the memory bank 10.

The amplified data is coupled to the comparison unit 30 via the global input/output lines. The comparison unit 30 compares such amplified data with exclusive OR gates (not shown) and outputs a result of the comparison. Each exclusive OR gate receives four bits of the amplified data selected by one of column lines CD0 through CD3 and compares the received four bits of the amplified data. If the four bits to an exclusive OR gate are the same, the exclusive OR gate outputs a data value of "0". Otherwise, the exclusive OR gate outputs a data value of "1".

The data values output from the exclusive OR gates are sent to external testing apparatus through the the output buffer 40. The external testing apparatus then determines whether the memory device is defective from received data values.

The conventional parallel testing apparatus 100 is directed to parallel testing one memory bank 10 of one memory device (i.e., memory chip). As storage capacity of the memory increases, the number of memory banks increases. So, the amount of data subject to simultaneous testing is limited when using the conventional parallel testing method, and more test time is needed as memory density increases.

In addition, it is desirable that the test system may analyze data bits from a memory device. However, the conventional parallel testing apparatus 100 does not output any stored data bits from the memory device 10. Furthermore, a memory module is comprised of a plurality of memory devices (i.e., a plurality of memory chips). Thus, an efficient mechanism for efficient testing of the plurality of memory chips of the memory module is desired.

SUMMARY OF THE INVENTION

According to the present invention, each memory chip of a memory module tests data bits from a plurality of memory blocks in parallel for efficient testing and outputs test data bits from one of the memory blocks.

According to an aspect of the present invention, a memory module includes a plurality of memory chips and a plurality of comparison units. Each comparison unit is disposed within a respective memory chip for testing a plurality of test data bits from a plurality of memory blocks. In addition, each comparison unit outputs test data bits from one of the memory blocks within the respective memory chip.

In another embodiment of the present invention, the memory module also includes a first module no-connection (NC) pin for receiving a test mode signal that is coupled to each of the memory chips. The test mode signal enables testing of the test data bits within each comparison unit. The memory module also includes a second module no-connection (NC) pin for receiving a respective test result signal from each of the memory chips. The respective test result signal indicates whether each memory chip is defective.

In a further embodiment of the present invention, the respective memory chip shuts down when the respective test result signal indicates that the respective memory chip is defective.

In another embodiment of the present invention, each comparison unit includes outputs portions that output the test data bits only if the respective memory chip is not defective, and that output fail signals instead of the test data bits when the respective memory chip is defective.

In a further embodiment of the present invention, each comparison unit compares a total of N test data bits from X memory blocks and outputs N/X test data bits.

In another embodiment of the present invention, each comparison unit includes a plurality of exclusive OR gates for comparing patterns of test data bits from the memory blocks.

In another aspect of the present invention, a memory chip includes a plurality of memory blocks and a comparison unit for testing a plurality of test data bits from the memory blocks and for outputting test data bits from one of the memory blocks. In a further embodiment of the present invention, the memory chip includes a sense amplifier for amplifying the test data bits.

In this manner, the memory module simultaneously tests a total of N test data bits from X memory blocks but outputs N/X test data bits. Thus, the test system processes less data bits (N/X test data bits) even though the memory module simultaneously tests a total of N test data bits for more efficient testing.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and/or function.

DETAILED DESCRIPTION OF THE INVENTION

Figure 2:
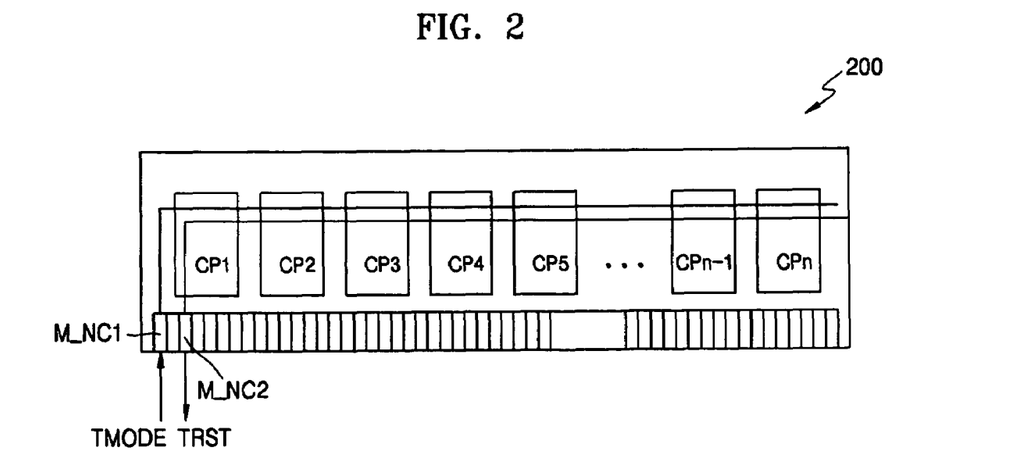
FIG. 2 shows a block diagram of a memory module for parallel testing, according to an embodiment of the present invention.
Figure 3A:
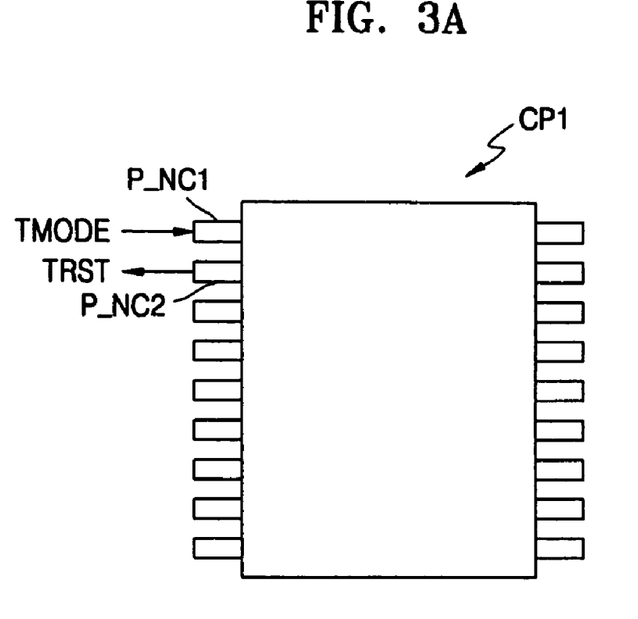
FIG. 3A shows a pin structure of one of the memory chips in the memory module of FIG. 2, according to an embodiment of the present invention.

Referring to FIG. 2, a memory module 200 includes a plurality of memory chips CP1, CP2, . . . , and CPn, a first module no-connection (NC) pin M_NC1, and a second module NC pin M_NC2. FIG. 3A shows one of the memory chips of FIG. 2 with a pin structure, and FIG. 3B shows one of the memory chips of FIG. 2 with a ball structure.

Figure 3B:
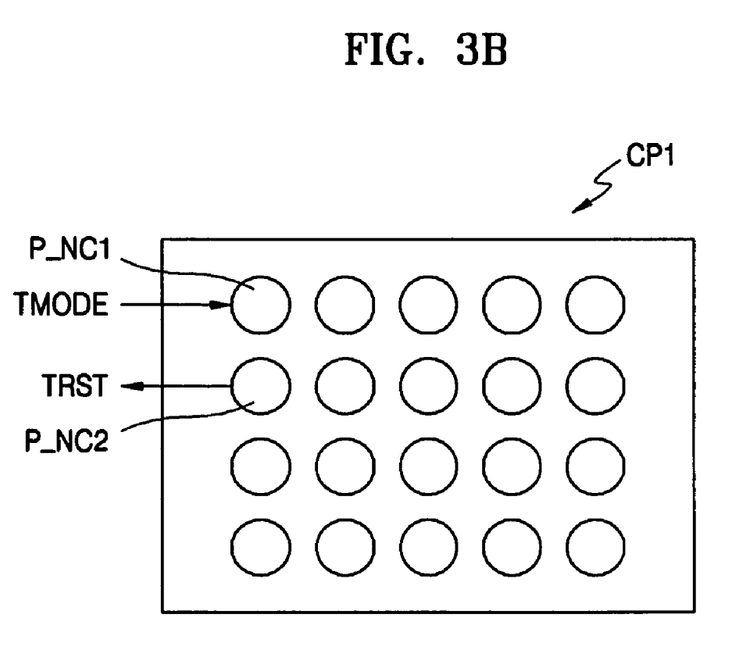
FIG. 3B shows a ball structure of one of the memory chips in the memory module of FIG. 2, according to an embodiment of the present invention.

Referring to FIGS. 2, 3A, and 3B, the first module NC pin M_NC1 receives a test mode signal TMODE and couples the test mode signal TMODE to a respective first NC pin P_NC1 of each of the memory chips CP1 through CPn. The second module NC pin M_NC2 receives a respective test result signal TRST from the second NC pin P_NC2 of each of the memory chips CP1 through CPn. The respective TRST signal indicates whether each of the memory chips CP1 through CPn is defective.

When the TMODE signal is activated (to a logical high state "1"), the memory module 200 performs parallel testing to be descried herein. When the TMODE signal is deactivated (to a logical low state "0"), the memory module 200 performs a typical memory test (i.e., tests one memory cell at a time) (step S444 of FIGS. 9, 10, and 11).

The TMOD signal may be set as DC voltages. For example, when the TMODE signal is set to a high voltage of 5V, each of the memory chips CP1 through CPn performs parallel testing. On the other hand, when the TMODE signal is set to a low voltage of 0V, each of the memory chips CP1 through CPn performs the typical test operation. Alternatively, the TMODE signal is generated using a mode register set (MRS) command in one embodiment of the present invention. In that case, if the MRS command is issued, the memory chips CP1 through CPn on the memory module 200 perform parallel testing. Alternatively, the TMODE signal may be set as DC voltages. In this case, the first module NC pin M_NC1 is not needed because TMODE signal is made by respective memory chips (such as when a MRS command issued by a combination of control signals such as /CS, /RAS, and /CAS).

Figure 4:
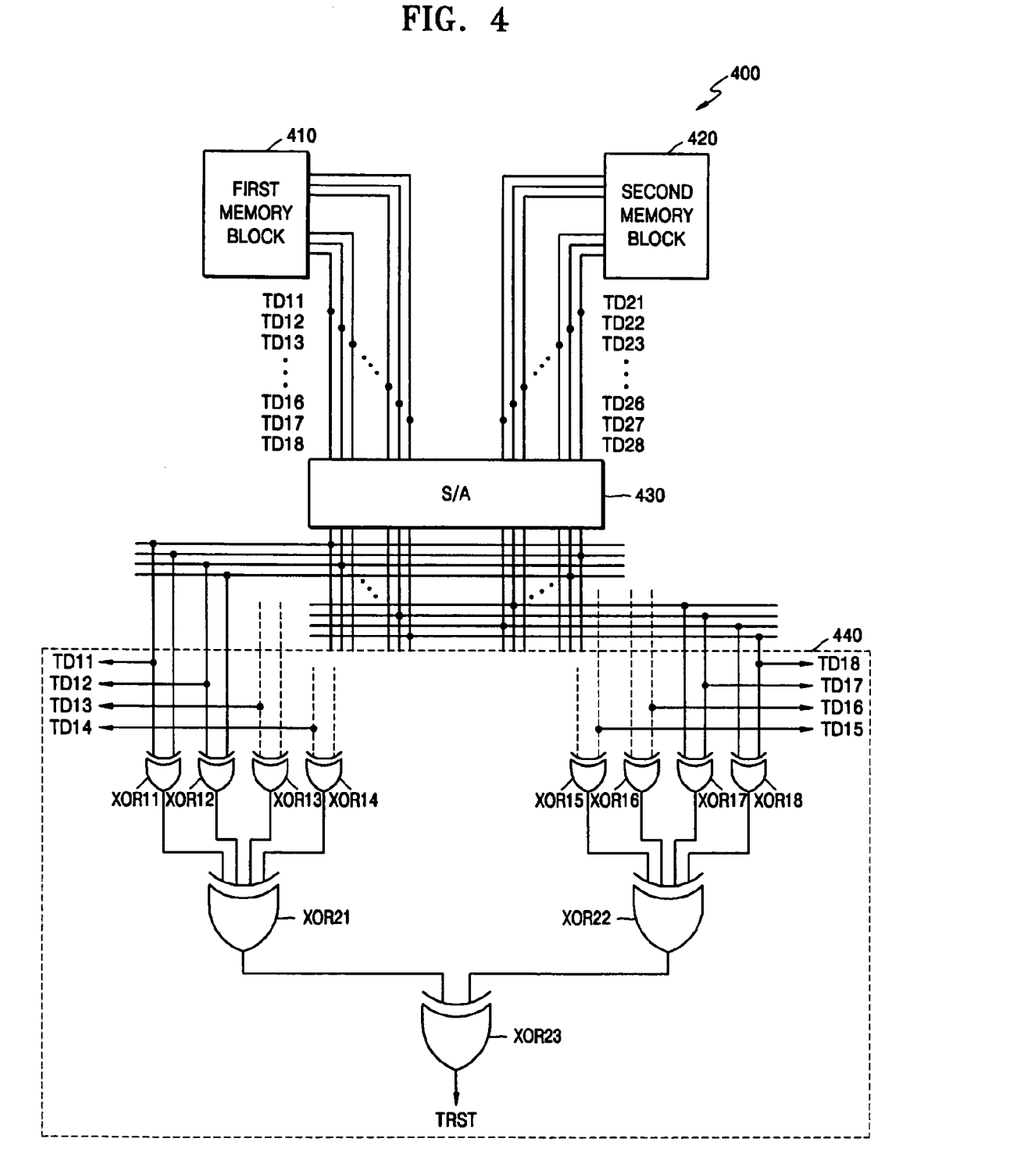
FIG. 4 shows a circuit diagram of one of the memory chips in the memory module of FIG. 2, according to an embodiment of the present invention.

FIG. 4 shows a circuit diagram of an example memory chip 400 that is one of the memory chips CP1 through CPn of FIG. 2. Each of the memory chips CP1 through CPn of FIG. 2 is similarly implemented as the example memory chip 400 of FIG. 4. Referring to FIG. 4, the memory chip 400 includes a plurality of memory blocks including first and second memory blocks 410 and 420, a sense amplification unit 430, and a comparison unit 440.

The memory chip 400 is divided into a plurality of memory banks (not shown), and each memory bank includes a plurality of memory blocks. A memory chip typically includes more numerous memory banks and memory blocks but the two memory blocks 410 and 420 in a memory bank is illustrated and described herein for simplicity and clarity.

The memory blocks 410 and 420 may be ×4 memory blocks, which output 4 bits at a time, ×8 memory blocks, which output 8 bits at a time, or ×16 memory blocks, which output 16 bits at a time. The memory chip 400 may include ×4, ×8, and ×16 memory blocks. For the convenience of explanation, the first and second memory blocks are illustrated in FIG. 4 as being ×8 memory blocks.

The sense amplification unit 430 amplifies test data bits TD11 through TD18 written on the first memory block 410 and test data bits TD21 through TD28 written on the second memory block 420. The comparison unit 440 compares a first bit pattern of the test data bits TD11 through TD18 of the first memory block 410 and a second bit pattern of the test data bits TD21 through TD28 of the second memory block 420 to generate the test result signal TRST. In addition, the comparison unit 440 outputs the test data bits TD11 through TD18 of the first memory block 410.

Figure 9:
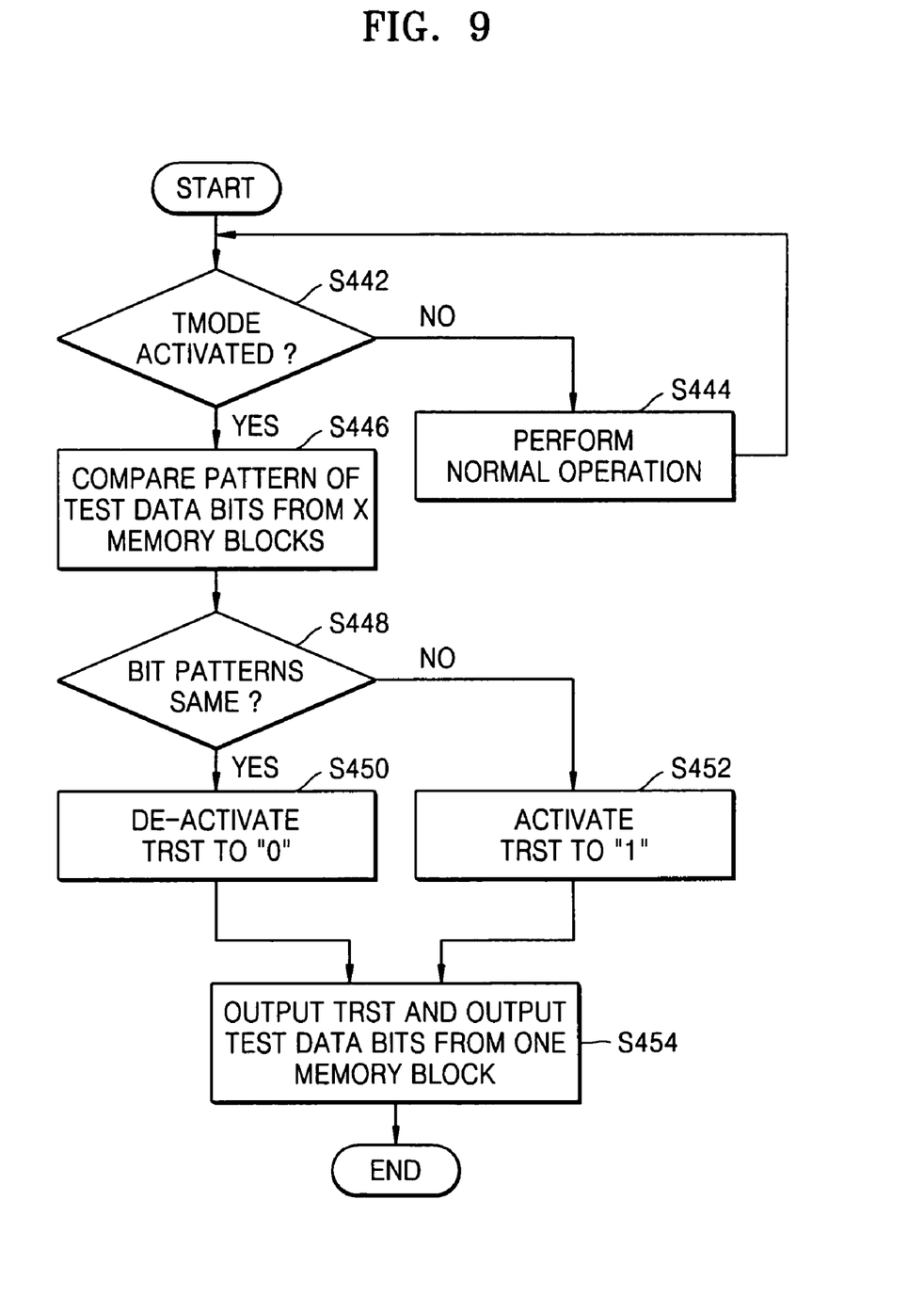
FIG. 9 shows a flow-chart of steps during operation of the memory chip of FIG. 4, according to an embodiment of the present invention.

FIG. 9 shows a flow-chart of steps during operation of the memory chip 400 of FIG. 4. Referring to FIGS. 4 and 9, when the TMODE signal applied on the first NC pin P_NC1 of the memory chip 400 is activated (step S442 of FIG. 9), two times more wordlines are activated than in a typical test operation. Thus, respective 8 test data bits (for a total of 16 test data bits) is written on each of the first and second memory blocks 410 and 420 simultaneously.

Thereafter, the first and second memory blocks 410 and 420 respectively generate the test data bits TD11 through TD18 and the test data bits TD21 through TD28 to the sense amplification unit 430. The sense amplification unit 430 amplifies the test data bits TD11 through TD18 and the test data bits TD21 through TD28 to a complementary metal oxide semiconductor (CMOS) level and outputs the amplified test data bits TD11 through TD18 and TD21 through TD28 to the comparison unit 440.

The memory chip 400 simultaneously tests a total of N test data bits from a total of N memory cells cumulatively within the two memory blocks 410 and 420. However, the memory chip 400 outputs the N/2 test data bits from one of the memory blocks 410 and 420. Generally, the memory chip 400 simultaneously tests a total of N test data bits from a total of N memory cells cumulatively within X memory blocks. In that case, the memory chip 400 outputs the N/X test data bits from one of the X memory blocks.

In one embodiment of the present invention, the comparison unit 440 includes a plurality of exclusive OR gates for comparing the first bit pattern of the test data bits TD11 through TD18 of the first memory block 410 and the second bit pattern of the test data bits TD21 through TD28 of the second memory block 420 to generate the test result signal TRST (step S446 of FIG. 9).

Each of a first level of exclusive OR gates XORL1, XOR12, XOR13, XOR14, XOR15, XOR16, XOR17, and XOR18 compares a respective one of the test data bits TD11 through TD18 of the first memory block 410 and a respective one of the test data bits TD21 through TD28 of the second memory block 420. Each of a second level of exclusive OR gates XOR21 and XOR22 inputs outputs of a respective set of four of the exclusive OR gates XOR11, XOR12, XOR13, XOR14, XOR15, XOR16, XOR17, and XOR18 in the first level.

Thus, the exclusive OR gate XOR21 inputs the outputs of the four exclusive OR gates XOR11, XOR12, XOR13, and XOR14, and the exclusive OR gate XOR21 inputs the outputs of the four exclusive OR gates XOR15, XOR16, XOR17, and XOR18. An exclusive OR gate XOR23 of a third level inputs the outputs of the exclusive OR gates XOR21 and XOR22 of the second level to generate the test result signal TRST.

Generally, an exclusive OR gate outputs a bit with a logical low state "0" if all inputs to the exclusive OR gate are the same logical state, and outputs a logical high state "1" if all inputs to the exclusive OR gate is not the same logical state. Thus, if the first bit pattern of the test data bits TD11 through TD18 of the first memory block 410 is same as the second bit pattern of the test data bits TD21 through TD28 of the second memory block 420, the outputs of each of the exclusive OR gates XOR11, XOR12, XOR13, XOR14, XOR15, XOR16, XOR17, XOR18, XOR21, XOR22, and XOR23 and the test result signal TRST are all a logical low state "0" (steps S448 and S450 of FIG. 9).

On the other hand, if the first bit pattern of the test data bits TD11 through TD18 of the first memory block 410 is not the same as the second bit pattern of the test data bits TD21 through TD28 of the second memory block 420, the output of at least one of the exclusive OR gates XOR11, XOR12, XOR13, XOR14, XOR15, XOR16, XOR17, and XOR18 and thus the test result signal TRST are a logical high state "1" (steps S448 and S452 of FIG. 9). If the test result signal TRST has a logical high state "1", the memory chip 400 is considered to be defective.

In any case, the test result signal TRST is output to the second module NC pin M_NC2 of the memory module 200 via the second NC pin P_NC2 (step S454 of FIG. 9). In addition, the comparison unit 440 outputs the test data bits TD11 through TD18 of the first memory block 410 (step S454 of FIG. 9) to output buffers (not shown).

The memory module 200 of an embodiment of the present invention further externally analyzes such test data bits output from the memory chip 400, whereas the conventional parallel testing apparatus 100 only determines whether each memory chip is defective. In one embodiment of the present invention, such test data bits TD11 through TD18 are output from the comparison unit before being applied to the exclusive OR gates XOR11 through XOR18.

Figure 5:
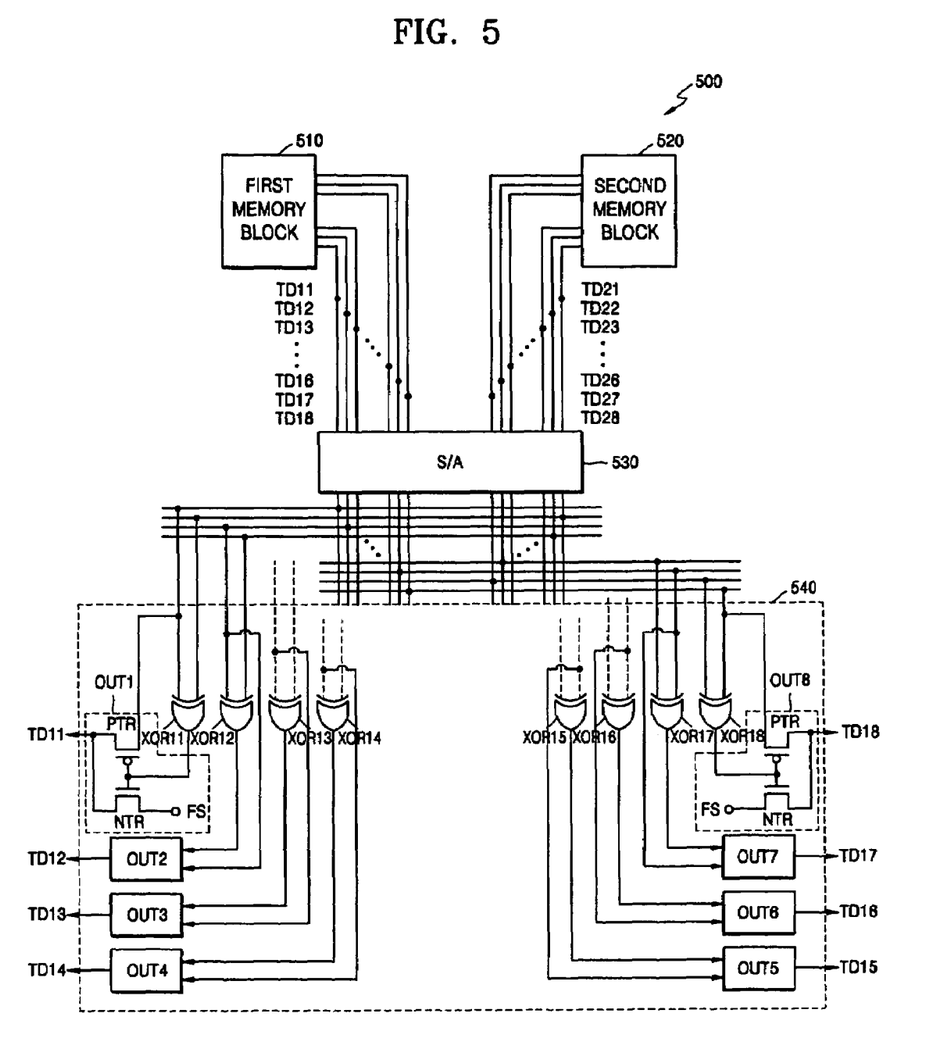
FIG. 5 shows a circuit diagram of one of the memory chips in the memory module of FIG. 2, according to another embodiment of the present invention.

In this manner, the memory chip 400 simultaneously tests a total of N test data bits from a total of N memory cells in X memory blocks while outputting N/X test data bits. Thus, a total of N memory cells may be tested using a testing apparatus (not shown) capable of simultaneously testing N/X memory cells. In the illustration of FIG. 5, N is 16 test data bits, and X is 2. For example, according to the present invention, it is possible to simultaneously test 512 MB memory chips using a 256 MB testing apparatus and thus considerably reduce the time taken to test the 512 MB memory chips, compared to the prior art.

FIG. 5 shows a circuit diagram of another example memory chip 500 that is one of the memory chips CP1 through CPn of FIG. 2. In that case, each of the memory chips CP1 through CPn of FIG. 2 is similarly implemented as the example memory chip 500 of FIG. 5. Referring to FIG. 5, the memory chip 500 includes a plurality of memory blocks including first and second memory blocks 510 and 520, a sense amplification unit 530, and a comparison unit 540. Similar to the memory chip CP1 of FIGS. 3A and 3B, the memory chip 500 of FIG. 5 may include a first NC pin for receiving the TMODE signal at such a pin M_NC1. Alternatively, if the TMODE signal is set by the MRS command, the memory device does not need to have such a NC pin.

Figure 10:
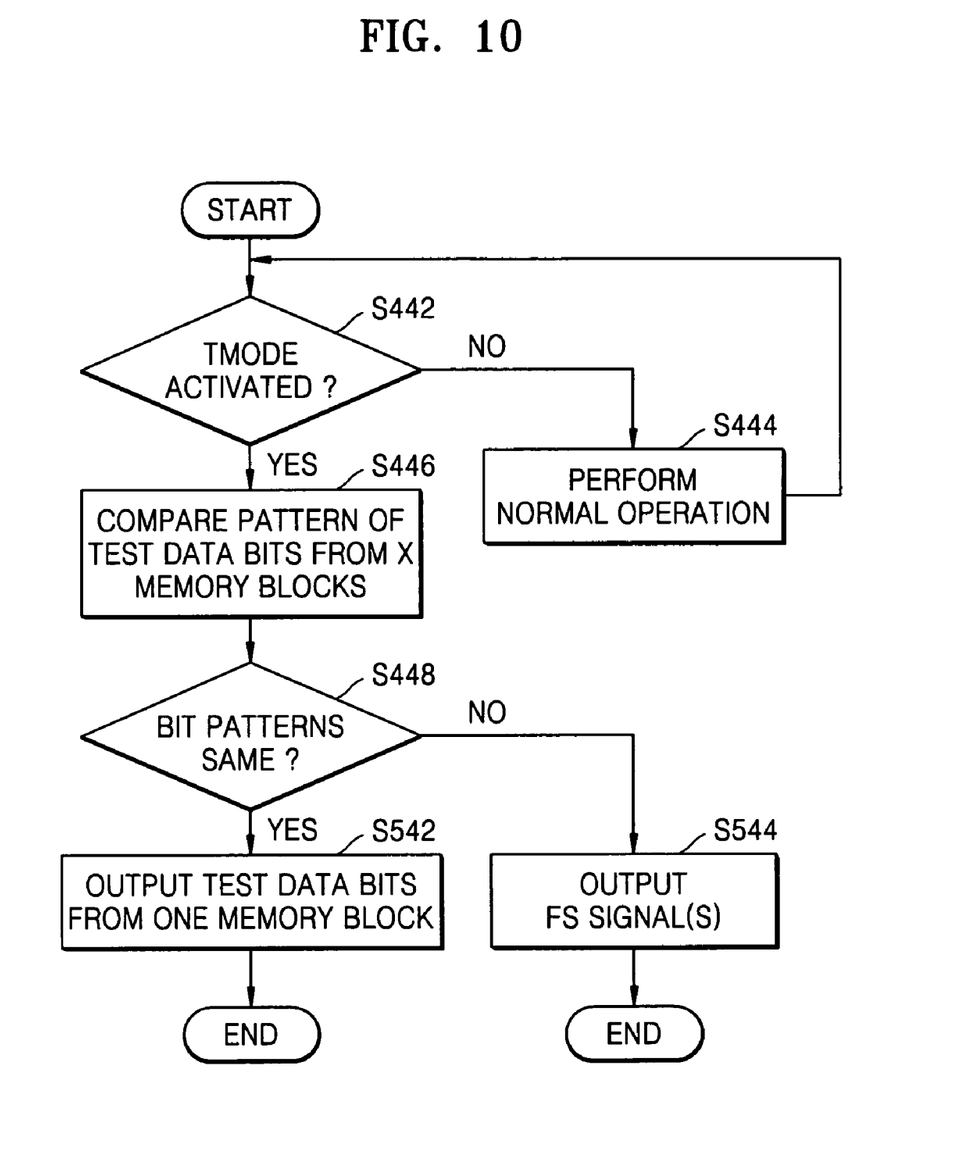
FIG. 10 shows a flow-chart of steps during operation of the memory chip of FIG. 5, according to an embodiment of the present invention.

FIG. 10 shows a flow-chart of steps during operation of the memory chip 500 of FIG. 5. The sense amplifier 530 and the exclusive OR gates XOR11, XOR12, XOR13, XOR14, XOR15, XOR16, XOR17, and XOR18 in FIG. 5 operate similarly as described in FIG. 4 for similarly performing the steps S422, S444, S446, and S448 in FIGS. 9 and 10.

However, in FIG. 5, the comparison unit 540 includes output portions OUT1, OUT2, OUT3, OUT4, OUT5, OUT6, OUT7, and OUT8 instead of the second and third levels of exclusive OR gates XOR21, XOR22, and XOR23. Each of the output portions OUT1, OUT2, OUT3, OUT4, OUT5, OUT6, OUT7, and OUT8 is implemented similarly as illustrated for the first output portion OUT1.

Each output portion OUT1 includes a PMOSFET (P-channel metal oxide semiconductor field effect transistor) PTR and an NMOSFET (N-channel metal oxide semiconductor field effect transistor) NTR having gates that are coupled together to an output of a respective exclusive OR gate XOR11. The drain of the PMOSFET PTR is coupled to the test data bit TD11 from the first memory block 510, and the drain of the NMOSFET NTR is coupled to a fail signal FS.

If the output of the respective exclusive OR gate XOR11 is a logical low state "0", then the PMOSFET PRT is turned on such that the output portion OUT1 outputs the test data bit TD11 from the first memory block 510. If the output of the respective exclusive OR gate XOR11 is a logical high state "1", then the NMOSFET NRT is turned on such that the output portion OUT1 outputs the fail signal FS. The fail signal is set at a predetermined voltage level that indicates that the memory chip 500 is defective.

Each of the other output portions OUT2, OUT3, OUT4, OUT5, OUT6, OUT7, and OUT8 operates similarly to the first output portion OUT1. Thus, each of the output portions OUT1, OUT2, OUT3, OUT4, OUT5, OUT6, OUT7, and OUT8 outputs the respective test data bit TD11, TD12, TD13, TD14, TD15, TD16, TD17, and TD18 from the first memory block 510 if the output from the respective exclusive OR gate XOR11, XOR12, XOR13, XOR14, XOR15, XOR16, XOR17, and XOR18 is a logical low state "0". Alternatively, each of the output portions OUT1, OUT2, OUT3, OUT4, OUT5, OUT6, OUT7, and OUT8 outputs the fail signal FS if the output from the respective exclusive OR gate XOR11, XOR12, XOR13, XOR14, XOR15, XOR16, XOR17, and XOR18 is a logical high state "1".

In this manner, referring to FIGS. 5 and 10, if the first bit pattern of the test data bits TD11 through TD18 of the first memory block 410 is the same as the second bit pattern of the test data bits TD21 through TD28 of the second memory block 420, the output portions OUT1, OUT2, OUT3, OUT4, OUT5, OUT6, OUT7, and OUT8 output the respective test data bit TD11, TD12, TD13, TD14, TD15, TD16, TD17, and TD18 from the first memory block 510 (step S542 of FIG. 10). If the first bit pattern of the test data bits TD11 through TD18 of the first memory block 410 is not the same as the second bit pattern of the test data bits TD21 through TD28 of the second memory block 420, at least one of the output portions OUT1, OUT2, OUT3, OUT4, OUT5, OUT6, OUT7, and OUT8 outputs the fail signal FS (step S544 of FIG. 10).

Similar to the memory chip 400 of FIG. 4, the memory chip 500 of FIG. 5 simultaneously tests a total of N test data bits from a total of N memory cells in X memory blocks while outputting N/X test data bits. Thus, a total of N memory cells may be tested using a testing apparatus (not shown) capable of simultaneously testing N/X memory cells.

Figure 6:
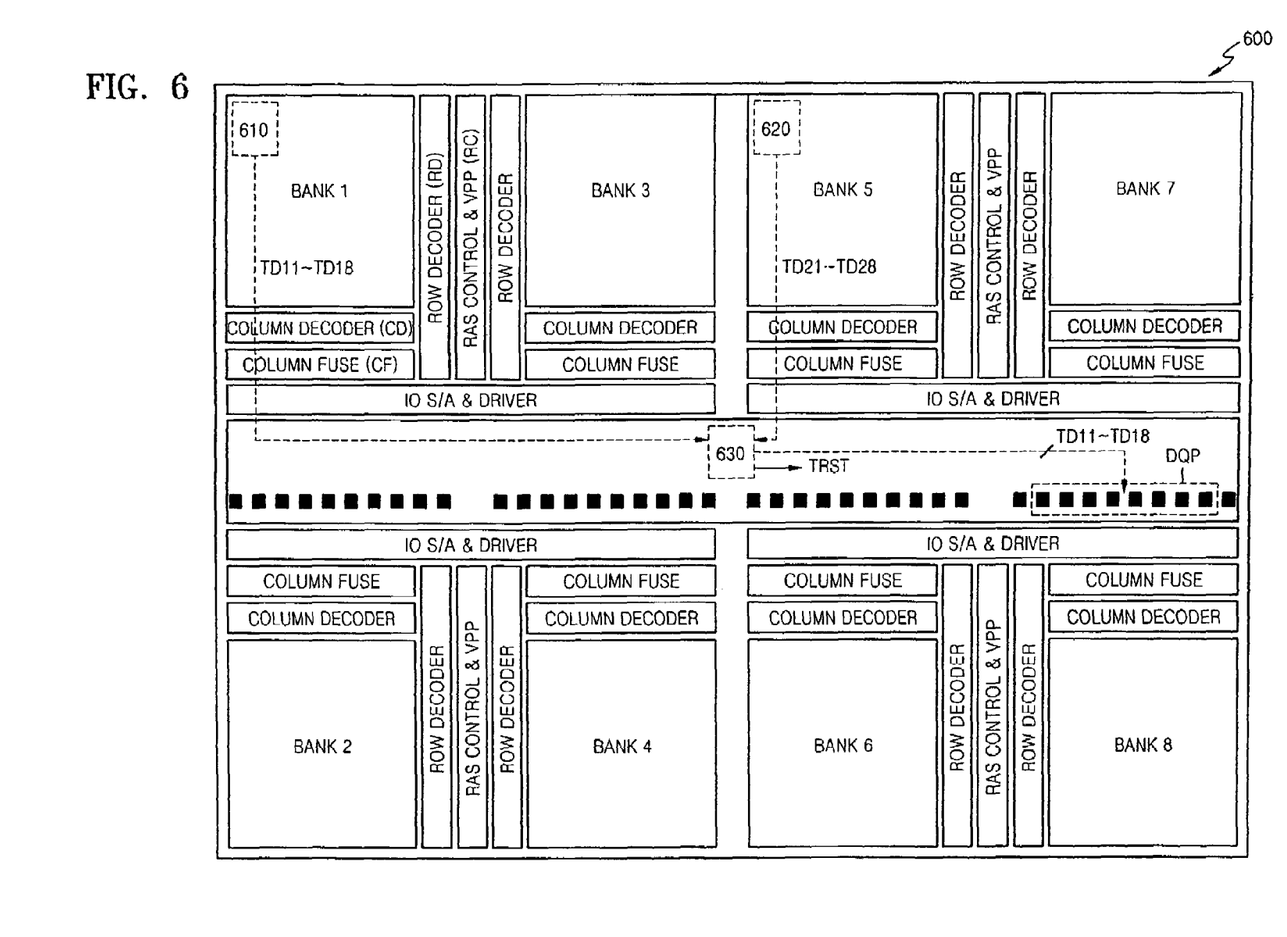
FIGS. 6 and 8 show block diagrams of a memory chip that shuts down when defective, according to an embodiment of the present invention.

FIG. 6 shows a block diagram of a semiconductor memory chip 600 according to another embodiment of the present invention. Referring to FIG. 6, the semiconductor memory chip 600 includes a plurality of memory banks BANK1 through BANK8. Each of the memory banks BANK1 through BANK8 includes a column decoder (CD), a column fuse (CF), a row decoder (RD), and a RAS (row access strobe) controller (RC).

Each of the memory banks BANK1 through BANK8 stores or outputs data bits using the column decoder, the column fuse, the row decoder, and the RAS controller, as known to one of ordinary skill in the art. In FIG. 6, only 8 memory banks, BANK1 through BANK8, are illustrated for simplicity and clarity of illustration. However, a semiconductor memory chip 600 typically includes more memory banks.

Figure 11:
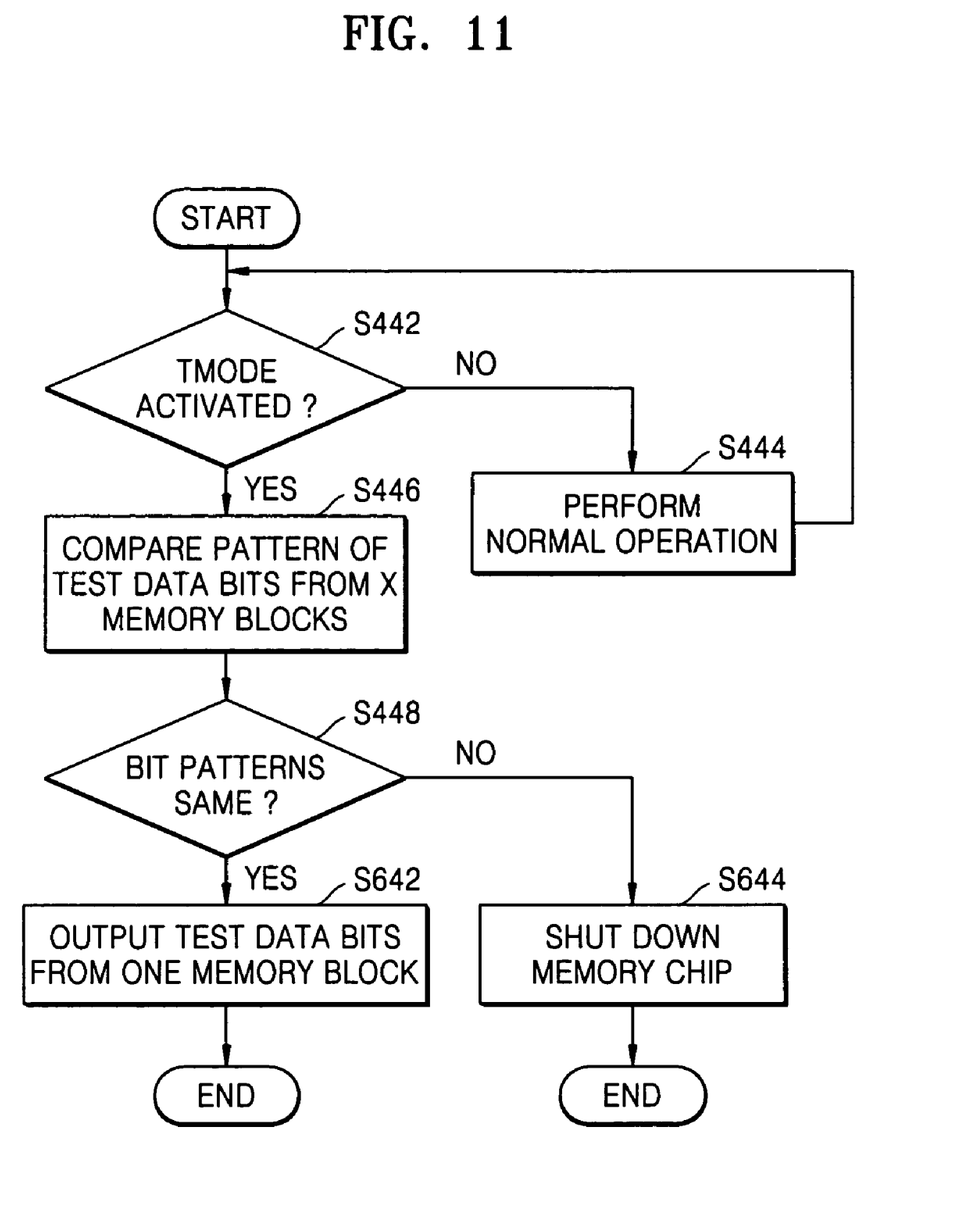
FIG. 11 shows a flow-chart of steps during operation of the memory chip of FIGS. 6 and 8, according to an embodiment of the present invention.

FIG. 11 shows a flow-chart of steps during operation of the memory chip 600 of FIG. 6. The semiconductor memory chip 600 includes a comparison unit 630 that is implemented similarly to the comparison unit 440 of FIG. 4 or 540 of FIG. 5. Thus, the steps S442, S444, S446, and S448 are similarly performed in FIGS. 9, 10, and 11 with the comparison unit 630 comparing the test data bits TD11 through TD18 from a first memory block 610 to the test data bits TD21 through TD28 from a second memory block 620 to generate the test result signal TRST if the comparison unit 630 is similar to the comparison unit 440 of FIG. 4.

If the first bit pattern of the test data bits TD11 through TD18 of the first memory block 610 is the same as the second bit pattern of the test data bits TD21 through TD28 of the second memory block 620, the comparison unit 630 outputs the test data bits from the first memory block 610 via output pads DQP of FIG. 6 for example (step S642 of FIG. 11). If the first bit pattern of the test data bits TD11 through TD18 of the first memory block 610 is not the same as the second bit pattern of the test data bits TD21 through TD28 of the second memory block 620, the memory chip 600 is determined to be defective, and operation of the memory chip 600 is shut down (step S644 of FIG. 11).

Figure 8:
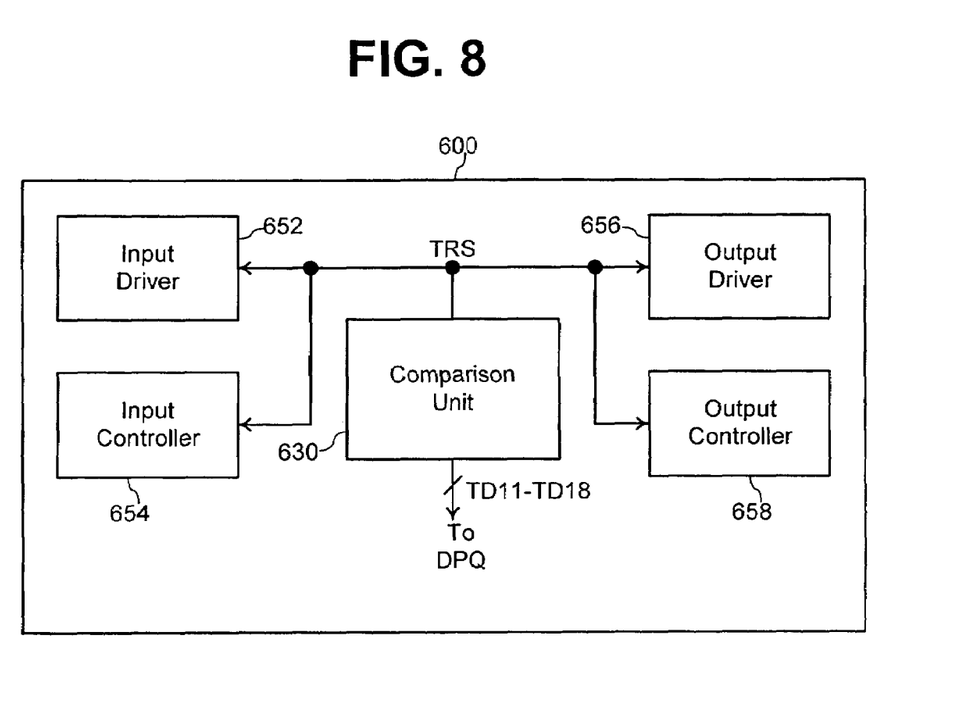

FIG. 8 shows a further block diagram of the semiconductor memory chip 600 of FIG. 6 including the comparison unit 630, an input driver 652, an input controller 654, an output driver 656, and an output controller 658. An input driver, an input controller, an output driver, and an output controller for a semiconductor memory chip are individually known to one of ordinary skill in the art.

In the memory chip of FIGS. 6 and 8, the TRST signal from the comparison unit 630 is not output but is rather used to shut down operation of at least one of the input driver 652, the input controller 654, the output driver 656, and the output controller 658 when the TRST signal has a logical high state "1" indicating that the memory chip 400 is defective. In that case, the memory chip 600 does not output any data or does not receive any data or commands input thereto such that a user of the semiconductor memory chip 600 realizes that the memory chip 600 is defective.

Alternatively, the TRST signal may be used to shut down operation of other components of the memory chip 600 such that a user may interpret abnormal operation of the memory chip 600 as indicating that the memory chip 600 is defective. On the other hand, if the TRST signal has a logical low state "0", the test data bits TD11 through TD18 of the first memory block 610 are output through the DQP pads.

The present invention may be practiced with the first and second memory blocks 610 and 620 located in the same memory bank or in separate memory banks. In the example of FIG. 6, the first and second memory blocks 610 and 620 are located in separate memory banks. In addition, the present invention may be practiced with the comparison unit 630 being implemented similarly as the comparison unit 530 of FIG. 5. In that case, the fail signal (FS) instead of the test result signal TRST operates to shut down operation of at least one of the input driver 652, the input controller 654, the output driver 656, and the output controller 658.

Figure 7:
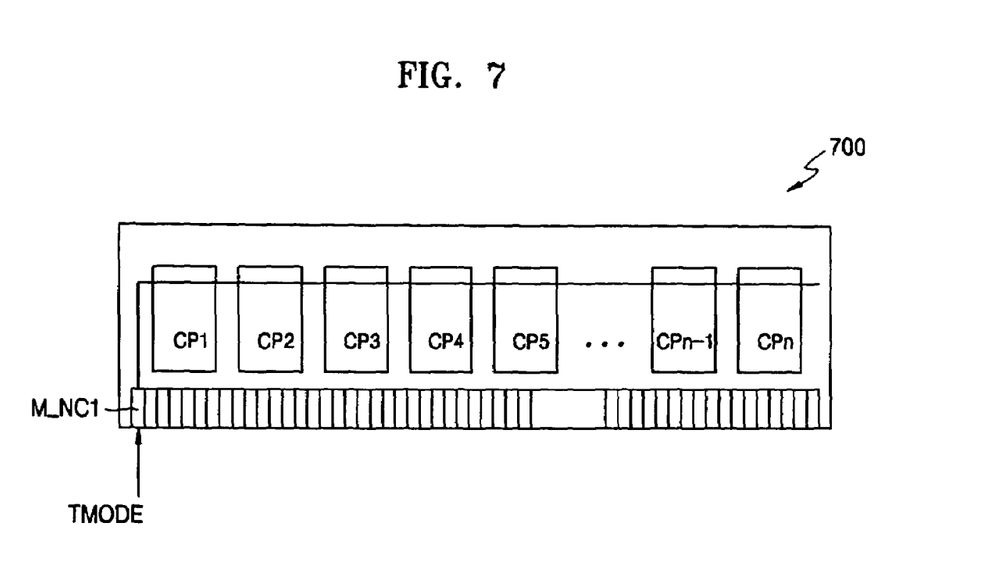
FIG. 7 is a diagram illustrating a memory module having a plurality of memory chips of FIG. 6, according to an embodiment of the present invention.

FIG. 7 is a diagram illustrating a memory module 700 having a plurality of semiconductor memory chips, with each semiconductor memory chip being implemented similarly as 600 of FIG. 6. Referring to FIG. 7, the memory module 700 is similar to the memory module 200 of FIG. 2. However, the memory module 700 of FIG. 7 does not include the second module NC pin M_NC2 since the test result signal TRST is not output. The semiconductor memory chips CP1 through CPn of the memory module 700 enter a test mode in response to the TMODE signal similar to the TMODE signal in the memory module 200 of FIG. 2.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, any numbers of elements illustrated and described herein are by way of example only. The present invention is limited only as defined in the following claims and equivalents thereof.

What is claimed is:

1. A memory module comprising:
   a plurality of memory chips; and
   a plurality of comparison units, each comparison unit disposed within a respective memory chip for testing a plurality of test data bits from a plurality of memory blocks and for outputting test data bits from one of the memory blocks within the respective memory chip.

2. The memory module of claim 1, further comprising:
   a first module no-connection (NC) pin for receiving a test mode signal that is coupled to each of the memory chips,
   wherein the test mode signal enables testing of the test data bits within each comparison unit.

3. The memory module of claim 1, further comprising:
   a second module no-connection (NC) pin for receiving a respective test result signal from each of the memory chips,
   wherein the respective test result signal indicates whether each memory chip is defective.

4. The memory module of claim 3, wherein the respective memory chip shuts down when the respective test result signal indicates that the respective memory chip is defective.

5. The memory module of claim 1, wherein each comparison unit includes outputs portions that output the test data bits only if the respective memory chip is not defective, and that output fail signals instead of the test data bits when the respective memory chip is defective.

6. The memory module of claim 1, wherein each comparison unit compares N test data bits from X memory blocks and outputs N/X test data bits.

7. The memory module of claim 1, wherein each comparison unit includes a plurality of exclusive OR gates for comparing patterns of test data bits from the memory blocks.

8. A method of testing a plurality of memory chips within a memory module, comprising:
   testing a plurality of test data bits from a plurality of memory blocks within each of the memory chips; and
   outputting test data bits from one of the memory blocks in each of the memory chips.

9. The method of claim 8, further comprising:
   coupling a test mode signal received at a first module no-connection (NC) pin of the memory module to each of the memory chips; and
   coupling a respective test result signal from each of the memory chips to a second module no-connection (NC) pin of the memory module.

10. The method of claim 8, further comprising:
    shutting down operation within any of the memory chips that is defective.

11. The method of claim 8, further comprising:
    outputting the test data bits only if a memory chip is not defective; and
    outputting fail signals instead of the test data bits when a memory chip is defective.

12. The method of claim 8, further comprising:
    comparing a total of N test data bits from X memory blocks in each memory chip; and
    outputting N/X test data bits from each memory chip.

13. The method of claim 8, further comprising:
    comparing patterns of test data bits from the memory blocks within each memory chip.

14. A memory chip comprising:
    a plurality of memory blocks; and
    a comparison unit for testing a plurality of test data bits from the memory blocks and for outputting test data bits from one of the memory blocks.

15. The memory chip of claim 14, further comprising:
    a sense amplifier for amplifying the test data bits.

16. The memory chip of claim 14, further comprising:
    a first no-connection (NC) pin for receiving a test mode signal that enables testing of the test data bits; and
    a second no-connection (NC) pin for outputting a respective test result signal that indicates whether the memory chip is defective.

17. The memory chip of claim 14, wherein the memory chip shuts down when the memory chip is defective.

18. The memory chip of claim 14, wherein the comparison unit includes outputs portions that output the test data bits only if the memory chip is not defective, and that output fail signals instead of the test data bits when the memory chip is defective.

19. The memory chip of claim 14, wherein the comparison unit compares N test data bits from X memory blocks and outputs N/X test data bits.

20. The memory chip of claim 14, wherein each comparison unit includes a plurality of exclusive OR gates for comparing patterns of test data bits from the memory blocks.

* * * * *